(12) United States Patent
Kanemaru et al.

(10) Patent No.: US 8,237,059 B2
(45) Date of Patent: Aug. 7, 2012

(54) ELECTRONIC COMPONENT-EMBEDDED BOARD AND METHOD OF MANUFACTURING THE SAME

(75) Inventors: Yoshikazu Kanemaru, Tokyo (JP); Takaaki Morita, Tokyo (JP); Kenichi Kawabata, Tokyo (JP)

(73) Assignee: TDK Corporation, Tokyo (JP)

( * ) Notice: Subject to any disclaimer, the term of this patent is extended or adjusted under 35 U.S.C. 154(b) by 986 days.

(21) Appl. No.: 12/219,355

(22) Filed: Jul. 21, 2008

(65) Prior Publication Data
US 2009/0025971 A1 Jan. 29, 2009

(30) Foreign Application Priority Data
Jul. 25, 2007 (JP) .................................. 2007-193836

(51) Int. Cl.
*H05K 1/16* (2006.01)
*H05K 1/18* (2006.01)

(52) U.S. Cl. ........................................ 174/260; 361/761
(58) Field of Classification Search ......................... None
See application file for complete search history.

(56) References Cited

U.S. PATENT DOCUMENTS

| | | | |
|---|---|---|---|
| 5,233,222 A * | 8/1993 | Djennas et al. | 257/676 |
| 5,844,319 A * | 12/1998 | Gamota et al. | 257/778 |
| 6,842,974 B1 | 1/2005 | Maenishi et al. | |
| 2001/0030061 A1 | 10/2001 | Yoneda | |
| 2006/0207088 A1 | 9/2006 | Yamano | |
| 2006/0208356 A1 * | 9/2006 | Yamano et al. | 257/734 |
| 2007/0210427 A1 | 9/2007 | Lytle et al. | |

FOREIGN PATENT DOCUMENTS

| | | |
|---|---|---|
| EP | 1 098 368 A1 | 5/2001 |
| EP | 1 320 288 A2 | 6/2003 |
| JP | A-62-291157 | 12/1987 |
| JP | A-09-135077 | 5/1997 |
| JP | A-2004-71698 | 3/2004 |
| JP | A-2004-311598 | 11/2004 |
| JP | A-2005-167141 | 6/2005 |
| JP | A-2006-261245 | 9/2006 |
| JP | A-2006-261246 | 9/2006 |

OTHER PUBLICATIONS

Mar. 23, 2011 Final Office Action issued in U.S. Appl. No. 12/219,354.
Sep. 22, 2010 Office Action issued in U.S. Appl. No. 12/219,354.
May 26, 2009 Search Report issued in European Patent Application No. 08 01 3360.

(Continued)

*Primary Examiner* — Timothy Thompson
*Assistant Examiner* — Roshn Varghese
(74) *Attorney, Agent, or Firm* — Oliff & Berridge, PLC

(57) ABSTRACT

A method of manufacturing an electronic component-embedded board is provided which is capable of suppressing warpage without requiring complicated processes at low cost and which offers high productivity and economic efficiency. A worksheet 100 includes insulating layers 21 and 31 on one surface of an approximately rectangular substrate 11, and an electronic component 41 and a plate-like frame member (member) 51 embedded inside the insulating layer 21, wherein the plate-like frame member 51 satisfying the relationship represented by the following formula (1): $\alpha 1 < \alpha 3$ and $\alpha 2 < \alpha 3$ ... (1), is mounted on an unmounted portion of the electronic component 41 on the substrate 11. In the formula, $\alpha 1$, $\alpha 2$ and $\alpha 3$ respectively denote the linear coefficients of thermal expansion (ppm/K) of the electronic component 41, the plate-like frame member 51, and the substrate 11, the respective wiring layers or the respective insulating layers.

5 Claims, 20 Drawing Sheets

OTHER PUBLICATIONS

Mar. 5, 2010 Office Action issued in Japanese Patent Application No. 2007-193836 (with translation).
Mar. 5, 2010 Office Action issued in Japanese Patent Application No. 2007-193838 (with translation).
U.S. Appl. No. 12/219,354, filed Jul. 21, 2008.
Feb. 5, 2010 Office Action cited in corresponding U.S. Appl. No. 12/219,354.
Mar. 16, 2010 European Search Report issued in European Application No. 08 01 3361.

* cited by examiner

ELECTRONIC COMPONENT-EMBEDDED BOARD AND METHOD OF MANUFACTURING THE SAME

BACKGROUND OF THE INVENTION

1. Field of the Invention

The present invention relates to an electronic component-embedded board and a method of manufacturing the same.

2. Description of the Related Art

In recent years, with the progress in electronics technology, there has been a growing demand towards higher density in printed circuit boards. As such, multilayer printed circuit boards in which are laminated pluralities of wiring patterns and insulating layers are becoming widely used.

Conventionally, for the purpose of increasing productivity, printed circuit boards used in these types of applications are manufactured in a "multiple dice from one substrate" manner in which, for example, an approximately 300 mm to 500 mm square worksheet (assembly substrate) provided with a plurality of wiring pattern groups (wiring layers) for printed circuit boards is separated into individual dice by dicing or the like to obtain a plurality of printed circuit boards (individual substrates, dice, or bodies). Multi-layering of the worksheet is normally achieved by alternately building up wiring patterns and insulating layers. Then, generally, a wiring pattern or the like is formed using a subtractive method or an additive method while an insulating layer is formed by thermal curing of a thermosetting resin.

With the conventional worksheet manufacturing method described above, warpage of a worksheet inevitably occurs due to stress applied during the formation of the insulation layers. Accordingly, in order to suppress warpage of the worksheet, for example, Japanese Patent Laid-Open No. 09-135077 and Japanese Patent Laid-Open No. 2005-167141 propose a manufacturing method in which a plurality of wiring pattern groups (wiring layers) for printed circuit boards as well as a frame-like conductive pattern that surrounds the plurality of wiring patterns are provided on a worksheet, whereby resin is applied so as to cover the wiring patterns and the frame-like conductive pattern to be subsequently cured.

[Patent Document 1] Japanese Patent Application Laid-Open No. 09-135077

[Patent Document 2] Japanese Patent Application Laid-Open No. 2005-167141

On the other hand, more and more mobile devices typified by, for example, a mobile terminal such as a mobile telephone are mounted with a so-called electronic component-embedded board in which a semiconductor element (die) in a bare chip-state is mounted as an active element on a substrate constituted by a single or a plurality of resin layers. Additionally, in order to meet the needs towards higher performances and smaller sizes in electronic devices, progress has been made in modularization involving mounting, in high density, active elements such as a semiconductor IC or the like and passive elements such as a varistor, a resistor, and a capacitor. Furthermore, there has been an ever-increasing demand towards a thinner profile for a module mounted with at least one of active elements and passive elements. As such, there is a pressing need for further thinning.

Under such circumstances, after applying the conventional worksheet manufacturing method described above when manufacturing an electronic component-embedded board, contrary to expectations, it was found that warpage of the electronic component-embedded board had not been suppressed and, rather, a deteriorating trend existed in comparison to the manufacturing of substrates not embedded with an electronic component. Moreover, according to findings by the present inventors, when thinning an electronic component-embedded board to a thickness of 500 μm or less and, in particular, to a thickness of 400 μm or less, excessive warpage of the order of several tens of millimeters tends to occur with respect to the entire worksheet. An occurrence of such an excessive warpage of the worksheet leads to the occurrence of manufacturing/processing problems such as, for example, conveyance failure, reduction in positional accuracy during build-up, and reduction in mounting positional accuracy during surface mounting, which causes not only a decline in process yield but also a decline in the mounting reliability of the obtained electronic component-embedded board.

At the same time, the warpage of a worksheet is conceivably suppressible through the formation an insulating layer in a state where the shape of the substrate is kept flat by grasping the worksheet from the outside using supporting members or the like. Unfortunately, in this case, the necessity of a grasping process each time an insulating layer is formed complicates manufacturing/processing and reduces productivity and economic efficiency.

The present invention was made in consideration of such circumstances, and an object thereof is to provide a method of manufacturing an electronic component-embedded board that does not require complicated processes, which is capable of suppressing the occurrence of warpage at low cost, and which offers high productivity and economic efficiency, and also to provide an electronic component-embedded board.

SUMMARY OF THE INVENTION

Extensive research carried out by the present inventors in order to solve the problems described above revealed that degrees (levels) of thermal expansion and thermal contraction caused by heat applied during the formation of an insulation layer or the like differ between an electronic component-mounting portion (a region of a substrate at which an electronic component is to be mounted) and an unmounted portion (a region of a substrate at which the electronic component is not mounted), and that nonuniform changes in properties, so to speak, causes imbalance in the stress applied to the substrate which, in turn, cause warpage such as that described above. The present invention was made as a result of these findings.

That is, a method of manufacturing an electronic component-embedded board according to the present invention includes the steps of: preparing a substrate; mounting an electronic component on the substrate; mounting, on an electronic component-unmounted portion of the substrate, a member satisfying the following formula (1), $$\alpha 1 < \alpha 3 \text{ and } \alpha 2 < \alpha 3 \tag{1};$$

forming an insulating layer on the substrate so as to cover the electronic component and the member; and forming a wiring layer on at least one of the substrate and the insulating layer. In the formula, $\alpha 1$ denotes the linear coefficient of thermal expansion of the electronic component (ppm/K), $\alpha 2$ denotes the linear coefficient of thermal expansion of the member (ppm/K), and $\alpha 3$ denotes the linear coefficient of thermal expansion of the substrate, the wiring layer or the insulating layer (ppm/K).

Note that, in the present specification, an "electronic component-embedded board" refers to a substrate on which at least one or more electronic components are provided, and shall include an assembly substrate such as a worksheet on which a plurality of the aforementioned individual substrates (dies) are formed as well as an assembly substrate (work board) of worksheets on which a plurality of the aforementioned individual substrates (dies) are formed. In addition, the electronic component of the "electronic component-embedded board" may either be embedded into the substrate or be exteriorly exposed. For example, a portion of a wiring structure such as a terminal which provides electrical connection may be exteriorly exposed. Furthermore, "forming a wiring layer on at least one of the substrate and the insulating layer" means that a wiring layer (pattern) is formed at one or more locations among a front surface of the substrate, a rear surface of the substrate, a front surface of an insulating layer, and a rear surface of an insulating layer.

In the present manufacturing method, an electronic component is mounted on the substrate and a member satisfying formula (1) is mounted on an electronic component-unmounted portion, and an insulating layer is formed so as to cover the electronic component and the member. With such an arrangement, since the linear coefficient of thermal expansion of the member is equal to or greater than the linear coefficient of thermal expansion of the electronic component and smaller than the linear coefficient of thermal expansion of the substrate, the wiring layer or the insulating layer, the linear coefficient of thermal expansion of the entire electronic component-unmounted portion (unmounted area; a region including only the substrate and the insulating area or a region including the substrate, the insulating layer, and the wiring layer) approximates the linear coefficient of thermal expansion of the entire electronic component-mounting portion (mounting area; a region to become the product area), and reduces the differences between the respective degrees of thermal expansion and thermal contraction of the entire electronic component-unmounted portion and the entire electronic component-mounting portion. As a result, nonuniform internal stress that occurs during the formation of the insulating layer is alleviated and the warpage of the electronic component-embedded board is suppressed. More specifically, according to the findings of the present inventors, it is suspected that warpage worsens when simply applying the conventional worksheet manufacturing method described above because the linear coefficient of thermal expansion of the electronic component is smaller than the linear coefficient of thermal expansion of the substrate, the insulating layer or the wiring layer and, consequently, when the electronic component is embedded, the differences in the respective linear coefficients of thermal expansion of the electronic component-unmounted area and the mounting area are further increased in comparison to the manufacturing of an substrate not embedded with the electronic component. In order to improve such relations, in the present manufacturing method, a member made up of a material whose linear coefficient of thermal expansion is smaller than that of the substrate, the insulating layer or the wiring layer is mounted in the electronic component-unmounted portion so as to reduce the linear coefficient of thermal expansion of the unmounted area to the same level as the linear coefficient of thermal expansion of the product area.

In addition, since the member installed within the insulating layer functions as an internal structure that improves the mechanical strength of the electronic component-embedded board and, consequently, shape variations of the substrate are suppressed against the application of stress, a synergistic effect is achieved in that warpage of the electronic component-embedded board is further suppressed. Moreover, with the electronic component-embedded board obtained as described above, since warpage is suppressed and the substrate strength has been improved, handleability during manufacturing/processing such as conveying, build up and surface mounting is improved, occurrences of manufacturing/processing problems are suppressed, process yield is improved, and mounting reliability is enhanced.

In the present manufacturing method, the member is preferably mounted so as to enclose the electronic component. In this manner, by disposing the member in, so to speak, a frame-like arrangement, the linear coefficient of thermal expansion and the mechanical strength of the unmounted portion enclosing the electronic component are averaged without local differences (i.e., without directional anisotropy). As a result, nonuniform internal stress is further alleviated, substrate strength is further enhanced, and warpage of the electronic component-embedded board is further suppressed.

In addition, the electronic component and the member are preferably mounted on approximately the same plane. Due to such an arrangement, nonuniform internal stress not only in the planar direction of the substrate but also in the thickness direction thereof is more readily alleviated. As a result, warpage of the electronic component-embedded board is more effectively suppressed.

In this case, the member described above is preferably thinner than the electronic component. Due to such an arrangement, for example, when pressurizing and curing resin to form an insulating layer, resin flows from the peripheral region of the electronic component-mounting portion to the unmounted portion in an easier manner. Consequently, pressure can now be uniformly applied to the electronic component in an easier manner, and the adhesion between the electronic component and the insulating layer as well as the evenness of the thickness of the electronic component-embedded board and the flatness thereof can be improved. Additionally, in this case, the efficient removal of bubbles that may exist or may be incorporated between the above-described member, wiring layer, insulating layer, electronic component and the like enables suppression of occurrences of manufacturing/processing problems. As a result, process yield and mounting reliability can be improved.

Furthermore, with the member described above, it is preferable that the spatial volume ratio occupied by the element within the insulating layer continuously or incrementally decreases in a direction towards the outer periphery (outer edge) of the substrate. Such an arrangement further enhances the aforementioned flowability of resin when, for example, pressurizing and curing resin to form an insulating layer, and further improvements can be achieved in the adhesion between the electronic component and the insulating layer as well as the evenness of the thickness of the electronic component-embedded board and the flatness thereof. As a result, occurrences of manufacturing/processing problems can be suppressed while process yield and mounting reliability can be improved.

Moreover, an electronic component-embedded board according to the present invention is a substrate that can be effectively produced by the manufacturing method of the present invention described above, and includes: a substrate; an electronic component mounted on the substrate; a member mounted on an electronic component-unmounted portion of the substrate and which satisfies the above formula (1); an insulating layer formed so as to cover the electronic component and the member; and a wiring layer formed on at least one of the substrate and the insulating layer.

According to the electronic component-embedded board and the method of manufacturing the same according to the present invention, by mounting a member satisfying a relationship of linear coefficients of thermal expansion represented by the above formula (1) on an electronic component-unmounted portion of the substrate, the respective degrees of thermal expansion and thermal contraction of the entire electronic component-mounting portion and the entire unmounted portion are equalized, and at the same time, the mechanical strength of the substrate is enhanced. As a result, nonuniform internal stress during heating and cooling can be alleviated with a simple configuration, and warpage of the electronic component-embedded board can be suppressed without requiring complicated processes. Consequently, since handleability during manufacturing/processing such as conveying, build up and surface mounting can be improved, occurrences of manufacturing/processing problems can be suppressed and process yield and mounting reliability can be enhanced.

DETAILED DESCRIPTION OF THE PREFERRED EMBODIMENTS

Figure 1:
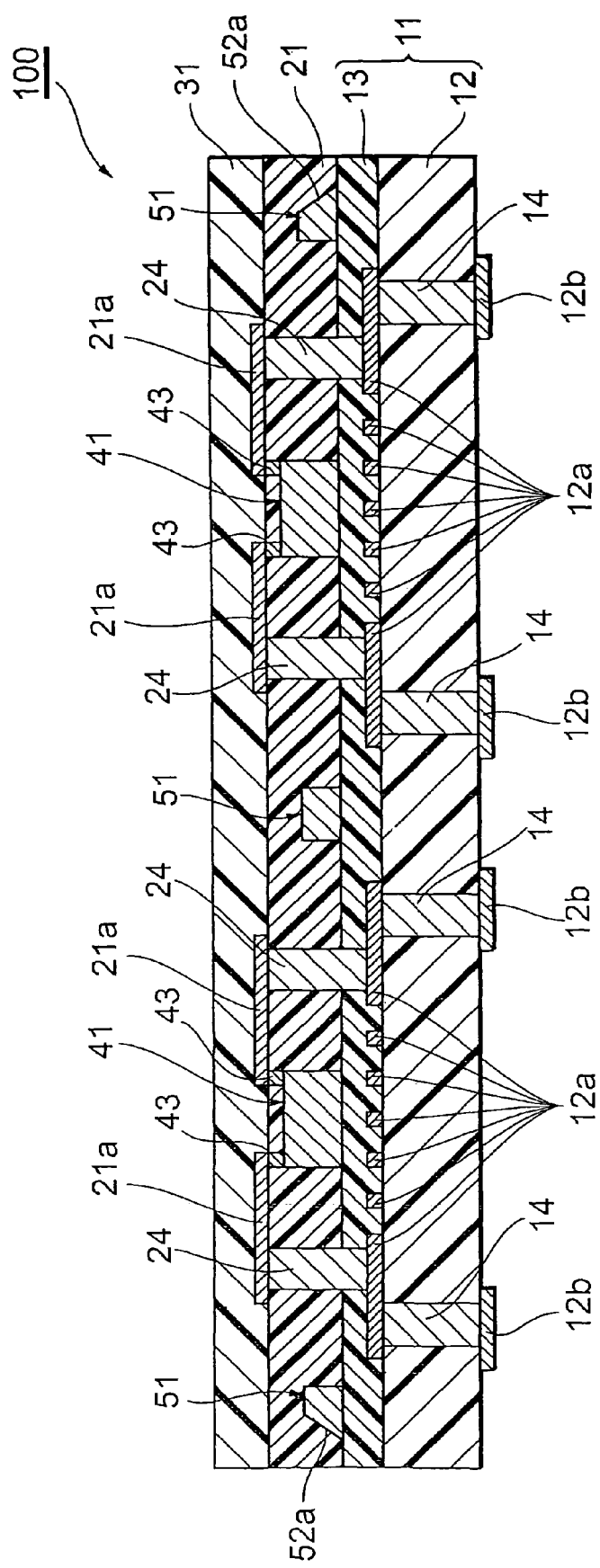
FIG. 1 is a schematic cross-sectional diagram showing substantial parts of a first embodiment of an electronic component-embedded board according to the present invention.

Hereinafter, embodiments of the present invention will be described with reference to the drawings. The embodiments are merely illustrative of the present invention and, as such, it is to be understood that the present invention is not limited to the described embodiments. That is, various modifications can be made to the present invention without departing from the true spirit and scope thereof. In the diagrams, like elements are denoted by like reference characters and redundant descriptions thereof are omitted. In addition, it is assumed that positional relationships between upward, downward, leftward, rightward, and the like shall be based on the positional relationships shown in the drawings unless otherwise specified. Furthermore, dimensions and ratios represented in the drawings are assumed not to be limited to those represented in the drawings.

First Embodiment

FIG. 1 is a schematic cross-sectional diagram showing substantial parts of a first embodiment of an electronic component-embedded board according to the present invention. A worksheet 100 is an electronic component-embedded assembly substrate that contains, within a sheet plane thereof, a total of four individual substrates arranged in a two-by-two grid, and includes insulating layers 21 and 31 on one surface (the shown upper surface) of an approximately rectangular substrate 11, and electronic components 41 and plate-like frame member (member) 51 embedded at predetermined positions inside the insulating layer 21.

The substrate 11 includes wiring layers (patterns) 12a and 12b formed on both faces of the insulating layer 12, and an insulating layer 13 laminated on top of the wiring layer 12a by vacuum pressure-bonding an insulating resin film on the wiring layer 12a. The wiring layer 12a and the wiring layer 12b are electrically connected to each other via a via 14 penetrating the insulating layer 12. In addition, a wiring layer 21a is formed on one surface (the shown upper surface) of the insulating layer 21, and the wiring layer 12a and the wiring layer 21a are electrically connected to each other via a via 24 penetrating the insulating layer 13 and the insulating layer 21.

Materials used for the insulating layers 12 and 13 are not particularly limited, and any material may be used in so far as such material is moldable into sheet-form or film-form. Specific examples of materials usable for the insulating layers 12 and 13 include: simple resins such as vinyl benzyl resin, polyvinyl benzyl ether compound resin, bismaleimide triazine resin (BT resin), polyphenylene ether (polyphenylene ether oxide) resin (PPE, PPO), cyanate ester resin, epoxy+active ester curable resin, polyphenylene ether resin (polyphenylene oxide resin), curable polyolefin resin, benzocyclobutene resin, polyimide resin, aromatic polyester resin, aromatic liquid crystal polyester resin, polyphenylene sulfide resin, polyetherimide resin, polyacrylate resin, polyether ether ketone resin, fluorine resin, epoxy resin, phenol resin and benzoxazine resin; materials obtained by adding, to these resins, silica, talc, calcium carbonate, magnesium carbonate, aluminum hydroxide, magnesium hydroxide, aluminum borate whisker, potassium titanate fibers, alumina, glass flakes, glass fibers, tantalum nitride, aluminum nitride, or the like; materials obtained by adding, to the aforementioned resins, metal oxide powder containing at least one metal selected from magnesium, silicon, titanium, zinc, calcium, strontium, zirconium, tin, neodymium, samarium, aluminum, bismuth, lead, lanthanum, lithium and tantalum; materials obtained by incorporating, into the aforementioned resins, glass fibers or resin fibers such as aramid fibers; and materials obtained by impregnating the aforementioned resins in a glass cloth, aramid fibers, nonwoven fabric, or the like. A suitable material can be selected and used as appropriate from the perspectives of electric properties, mechanical properties, water absorption, reflow resistance and the like.

Figure 2:
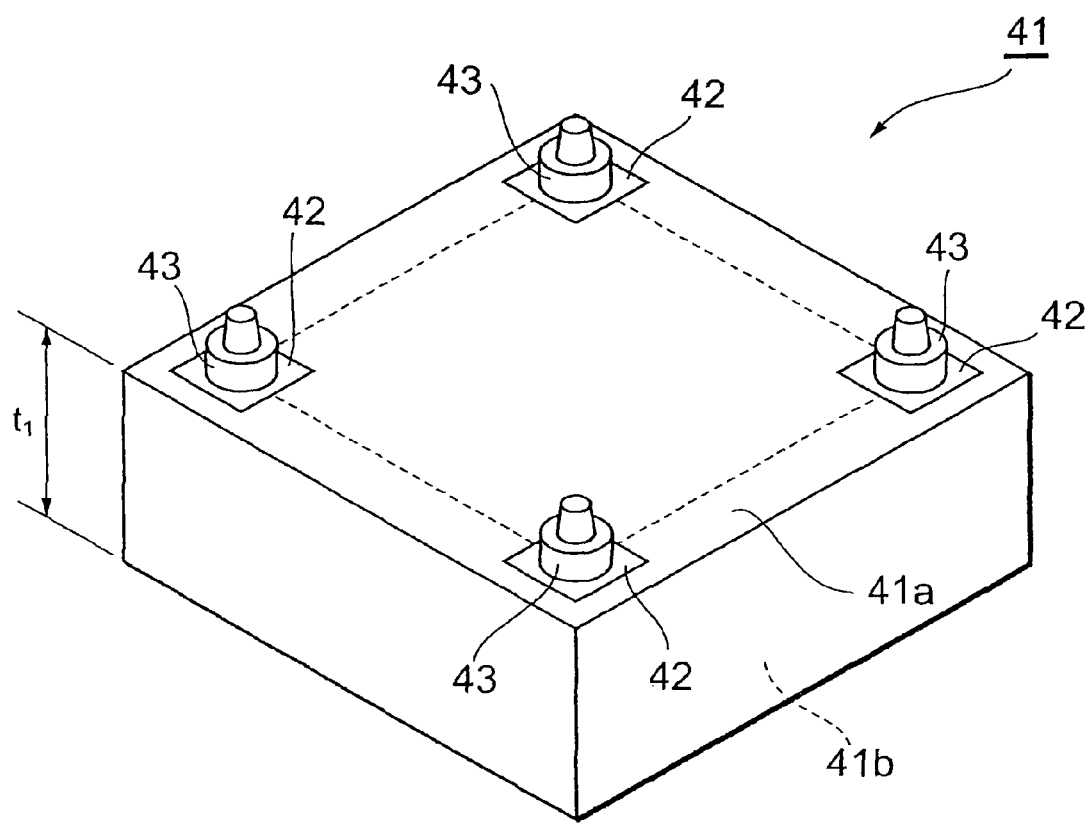
FIG. 2 is a perspective view showing a schematic configuration of an electronic component 41.

The insulating layers 21 and 31 are made of a thermosetting resin. Specific resin materials that can be used, either individually or in combination thereof, include: epoxy resin, phenol resin, vinyl benzyl ether compound resin, bismaleimide triazine resin, cyanate ester resin, polyimide, polyolefin resin, polyester, polyphenylene oxide, liquid crystalline polymer, silicone resin, fluorine resin, and the like. In addition, a rubber material such as acrylic rubber and ethylene-acrylic rubber or a resin material partially including a rubber component may be used. Furthermore, usable materials include: those obtained by adding, to the aforementioned resins, silica, talc, calcium carbonate, magnesium carbonate, aluminum hydroxide, magnesium hydroxide, aluminum borate whisker, potassium titanate fibers, alumina, glass flakes, glass fibers, tantalum nitride, aluminum nitride, or the like; materials obtained by adding, to the aforementioned resins, metal oxide powder containing at least one metal selected from magnesium, silicon, titanium, zinc, calcium, strontium, zirconium, tin, neodymium, samarium, aluminum, bismuth, lead, lanthanum, lithium and tantalum; materials obtained by incorporating, into the aforementioned resins, glass fibers or resin fibers such as aramid fibers; and materials obtained by impregnating the aforementioned resins in a glass cloth, aramid fibers, nonwoven fabric, or the like. A suitable material can be selected and used as appropriate from the perspectives of electric properties, mechanical properties, water absorption, reflow resistance and the like FIG. 2 is a perspective view schematically showing a configuration of the electronic component 41. The electronic component 41 is a semiconductor IC (die) in a bare-chip state, and includes numerous land electrodes 42 on a primary surface 41a thereof having an approximately rectangular plate-shape. Note that, in the diagram, land electrodes 42 and bumps (terminals) 43, to be described hereinafter are only shown at the four corners, and other land electrodes 42 have been omitted. In addition, types of the electronic component 41 are not particularly limited and typical examples thereof include digital ICs with extremely high operating frequencies such as a CPU or a DSP.

A rear surface 41b of the electronic component 41 is polished, whereby the thickness t1 (the distance from the primary surface 41a to the rear surface 41b) of the electronic component 41 is set so as to be smaller than an ordinary semiconductor IC. More specifically, the thickness t of the electronic component 41 is set to, for example, 200 µm or less, preferably to 100 µm or less, and more preferably to around 20 to 50 µm. In addition, the rear surface 41b of the electronic component 41 is preferably roughened by etching, plasma treatment, laser irradiation, blasting, buffing, chemical treatment or the like in order to enhance thinning or adhesion.

Polishing of the rear surface 41b of the electronic component 41 is preferably performed collectively in the wafer state for a large number of electronic components 41, whereby the electronic components 41 are subsequently separated from each other by dicing. When dicing is performed to separate individual electronic components 41 prior to reducing thickness by polishing, the rear surface 41b can be polished in a state where the primary surface 41a of the electronic component 41 is covered by a thermosetting resin or the like.

A bump (terminal) 43 that is a type of a conductive protrusion is formed on each land electrode 42. The bump 43 is not limited to any particular type, and examples of various types of usable bumps include a stud bump, a plate bump, a plating bump, and a ball bump. Stud bumps are exemplified in the diagram. When stud bumps are used as the bumps 43, the stud bumps may be formed by wire bonding of silver (Ag) or copper (Cu), and when plate bumps are used, the plate bumps may be formed by plating, sputtering, or vapor deposition. When plating bumps are used, the bumps may be formed by plating, and when ball bumps are used, the bumps may be formed by either mounting a solder ball on the land electrode 42 and then melting the same or by printing a cream solder on the land electrode and then melting the same. Also usable are bumps having a conical shape, a cylindrical shape or the like formed by screen-printing and curing a conductive material, or bumps formed by printing a nanopaste and sintering the same by heating.

Types of metals that can be used for the bumps 43 are not particularly limited, and examples of usable metals include gold (Au), silver (Ag), copper (Cu), nickel (Ni), tin (Sn), chromium (Cr), nickel/chromium alloy, solder, and the like. Among these metals, when connectivity and migration are taken into consideration, it is preferable to use gold or copper, and more preferably, copper. By using copper as the material for the bumps 43, in comparison to a case where, for example, gold is used, a high-strength bond to the land electrodes 42 can be obtained and the reliability of the electronic component 41 itself can be enhanced.

The dimensions and shape of the bump 43 can be appropriately set according to the intervals (pitch) between the land electrodes 42. For example, when the pitch of the land electrodes 42 is approximately 100 µm, setting the maximum diameter of the bumps 43 to around 10 to 90 µm and the height thereof to around 2 to 100 µm shall suffice. After cutting and separation into individual electronic components 41 by wafer dicing, the bumps 43 can be bonded to the respective land electrodes 42 using wire bonding.

Figure 3:
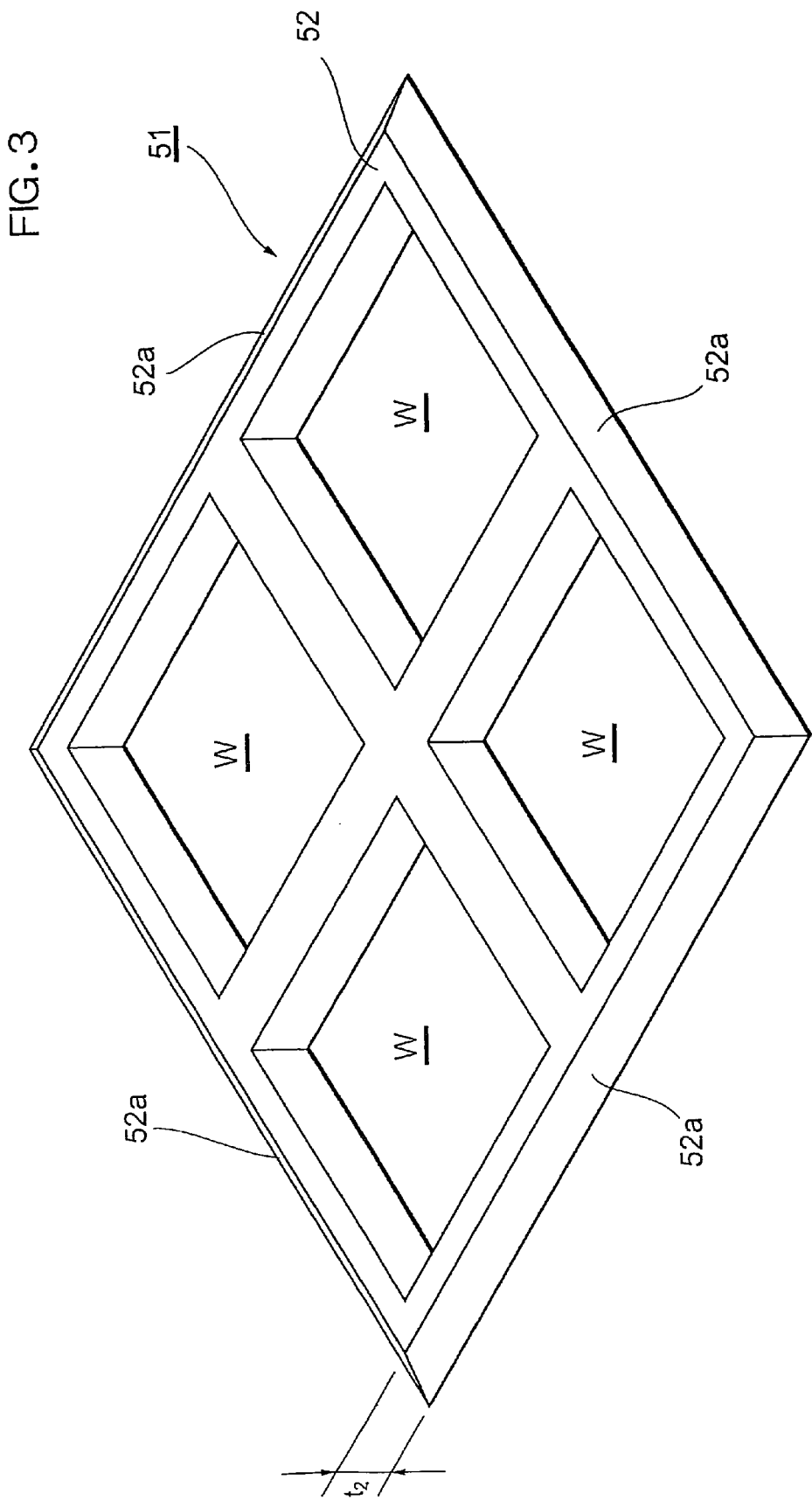
FIG. 3 is a perspective view showing a schematic configuration of a plate-like frame member 51.

FIG. 3 is a perspective view schematically showing a configuration of the plate-like frame member 51. The plate-like frame member 51 used in the present embodiment is constituted by a lattice-shape frame portion 52 in which four windows W have been partitioned. The outer shape of the frame portion 52 is approximately rectangular and is approximately similar to the outer shape of the substrate 11, and is designed so that the outer dimensions thereof is slightly smaller than that of the substrate 11. In addition, the frame portion 52 includes an inclined surface 52a that is inclined in a direction towards the outer periphery of the frame. Consequently, the thickness of the frame portion 52 decreases in the direction towards the outer periphery of the frame. Furthermore, the thickness t2 (thickest portion) of the frame portion 52 is preferably slightly thinner than the thickness t1 of the electronic component 41.

Materials usable for the plate-like frame member 51 are not particularly limited in so far as the materials satisfy a relation represented by the following formula (1):

$$\alpha 1 < \alpha 3 \text{ and } \alpha 2 < \alpha 3 \qquad (1),$$

in which α1 denotes the linear coefficient of thermal expansion of the electronic component 41 (ppm/K), α2 denotes the linear coefficient of thermal expansion of the plate-like frame member 51 (ppm/K), and α3 denotes the linear coefficient of thermal expansion of the substrate 11, the respective wiring layers or the respective insulating layers (ppm/K). Generally, with an electronic component, a substrate, a wiring layer and an insulating layer used in these types of applications, since α1 is around 1 to 8 ppm/K and α3 is around 14 to 20 ppm/K, α2 preferably ranges from 3 to 16 ppm/K. More specifically, usable materials include metals, alloys, resins and the like whose linear coefficient of thermal expansion ranges from 3 to 16 ppm/K such as SUS 400 (11 ppm/K), SUS 410 (11 ppm/K), SUS 430 (10.5 ppm/K), SUS 630 (11 ppm/K), SUS 631 (10 ppm/K), SUS 316 (16 ppm/K), 42 alloy (4.5 ppm/K), inconel (14 ppm/K), nickel (12.5 ppm/K), nickel-chromium-molybdenum steel (11 ppm/K), iron (11 ppm/K), cast iron (10 ppm/K), titanium (9 ppm/K), aromatic polyamide (product name: Mictron GQ; 13 ppm/K), aromatic polyamide (product name: Mictron ML; 3 ppm/K), PET (15 ppm/K), and polyimide (3 to 15 ppm/K). Among these materials, SUS 430 or inconel is preferably used from the perspectives of workability, availability, inflexibility, cost and the like, and more preferably, SUS 430 is used.

Hereinafter, a method of manufacturing an example of the worksheet 100 described above which includes four individual substrates respectively embedded with three electronic components 41 will be described with reference to FIGS. 4 to 14.

Figure 4:
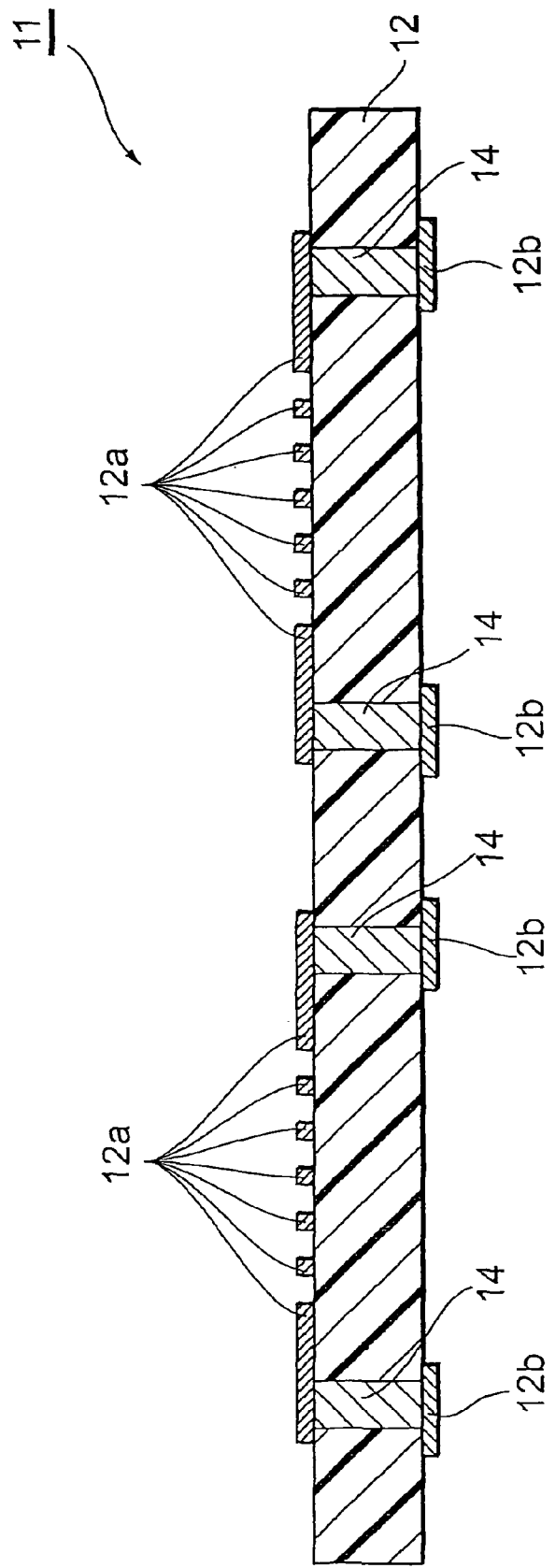
FIG. 4 is a flowchart showing an example of procedures for manufacturing a worksheet 100.
Figure 5:
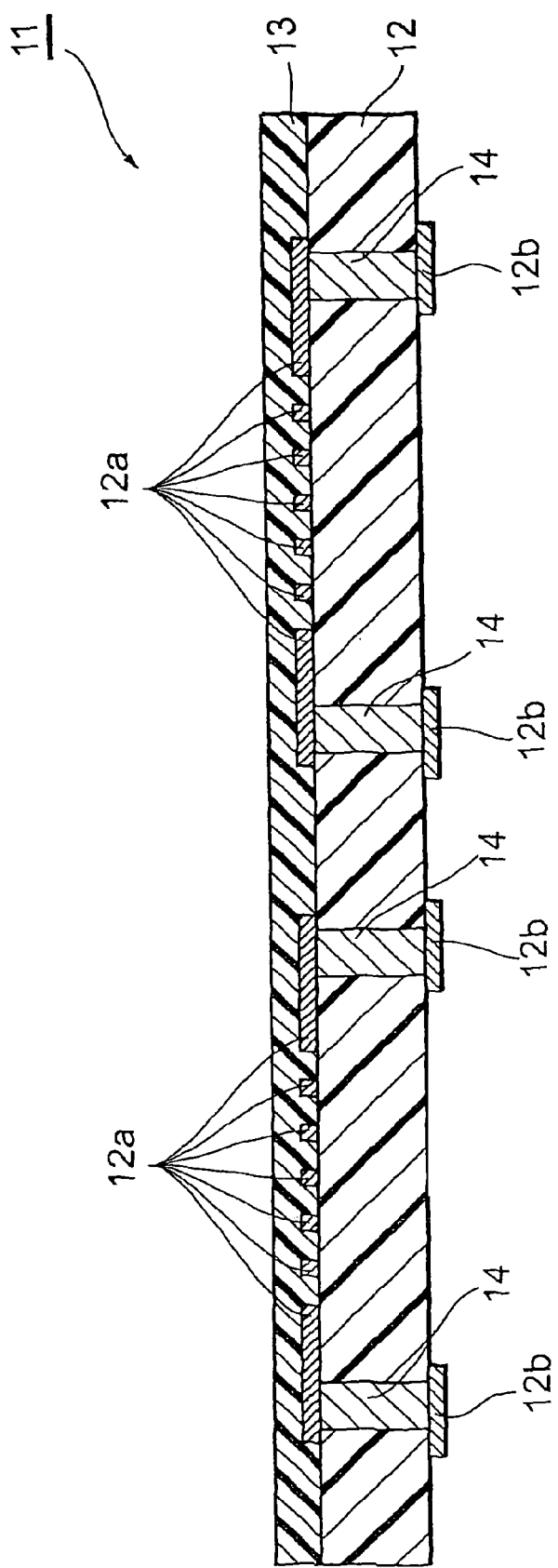
FIG. 5 is a flowchart showing an example of procedures for manufacturing the worksheet 100.

A substrate 11 on which are formed wiring layers (patterns) 12a, 12b and a via 14 is prepared using a known method involving drilling and punching a double-sided copper-clad glass epoxy, subsequently applying electrolytic plating and electrolytic plating, removing unnecessary portions by etching, and the like (FIG. 4). In this case, circuit configurations constituted by the wiring layers 12a, 12b and the via 14 are respectively formed at four locations corresponding to the respective windows W of the plate-like frame member 51 so as to be spaced from each other. Then, an insulating layer 13 is further formed on top of the wiring layer 12a of the substrate 11 (FIG. 5). Subsequently, the substrate 11 obtained through the operations described above is mounted and fixed to a predetermined position on a stainless steel workstage, not shown, whereby the following processes are performed thereon.

Figure 6:
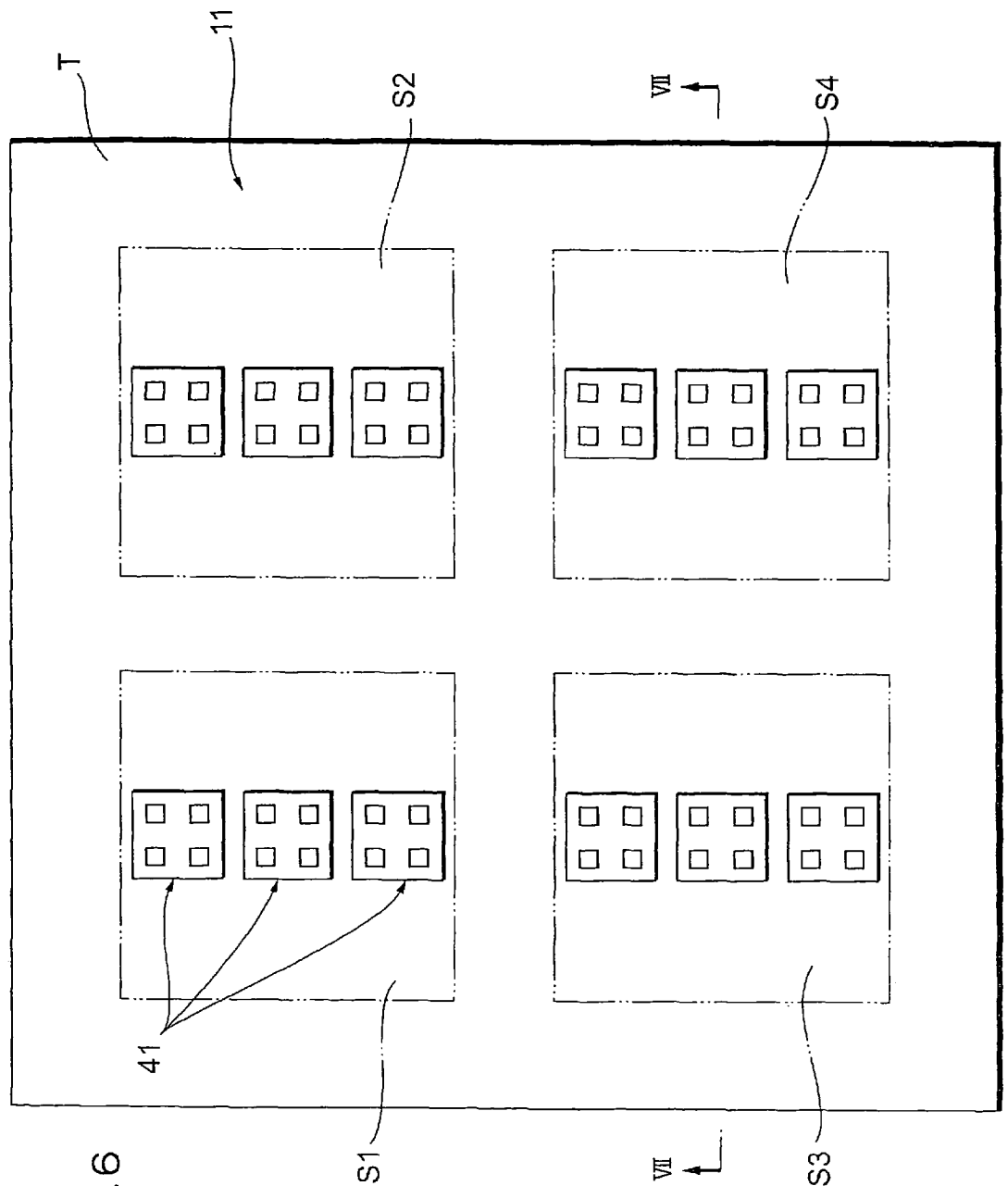
FIG. 6 is a flowchart showing an example of procedures for manufacturing the worksheet 100.
Figure 7:
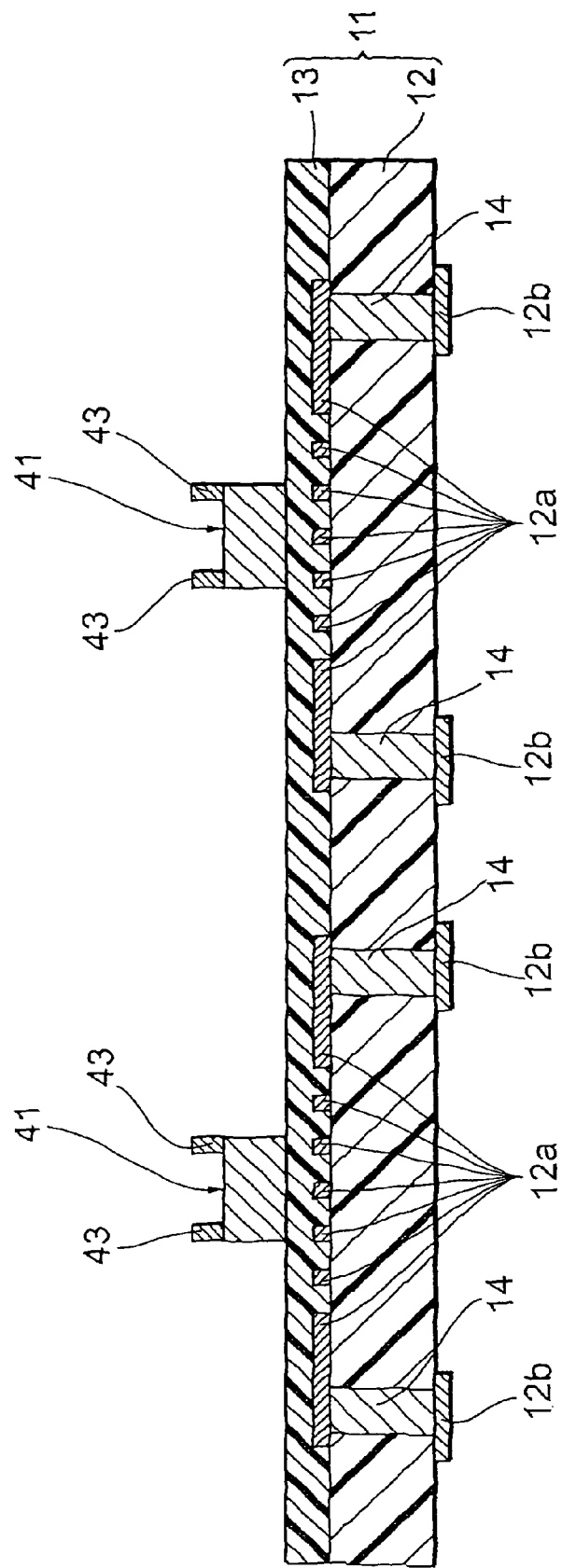
FIG. 7 is a cross-sectional diagram taken along the line VII-VII in FIG. 6.

Next, the electronic components 41 are mounted on predetermined positions in product areas S1 to S4 on the insulating layer 13 of the substrate 11 (FIGS. 6 and 7). In this case, the product areas S1 to S4 are work regions of the individual substrates defined based on the circuit configurations such as the wiring layers 12a, 12b and the via 14. In this case, as described above, since four of the same circuit configurations are formed at four locations on the substrate 11 corresponding to the respective windows W of the plate-like frame member 51, defined in correspondence thereto are product areas S1 to S4 arranged so as to be spaced from each other in a two-by-two grid and a lattice-shape non-product area T (the region other than the product areas S1 to S4) (FIG. 6).

Figure 8:
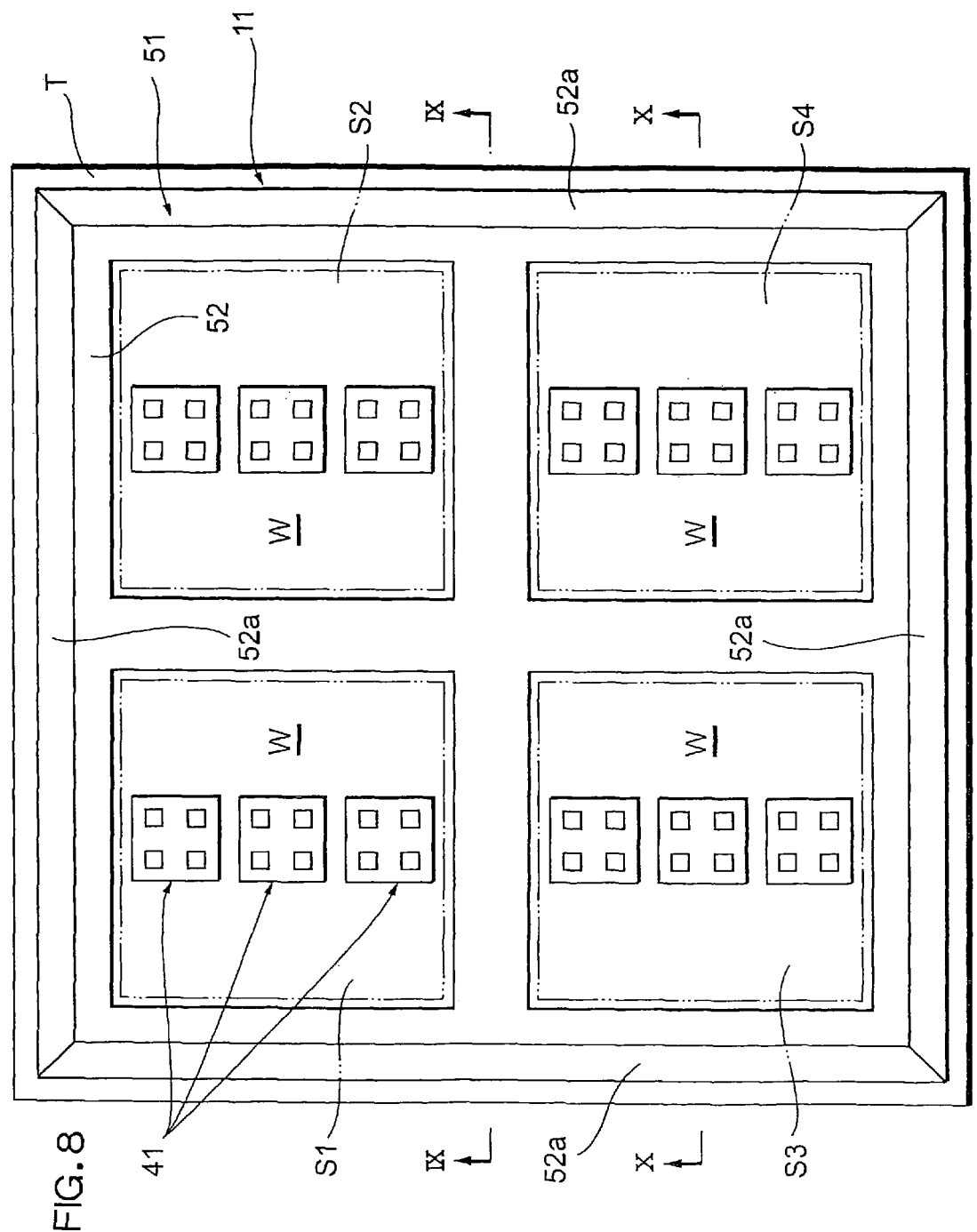
FIG. 8 is a flowchart showing an example of procedures for manufacturing the worksheet 100.
Figure 9:
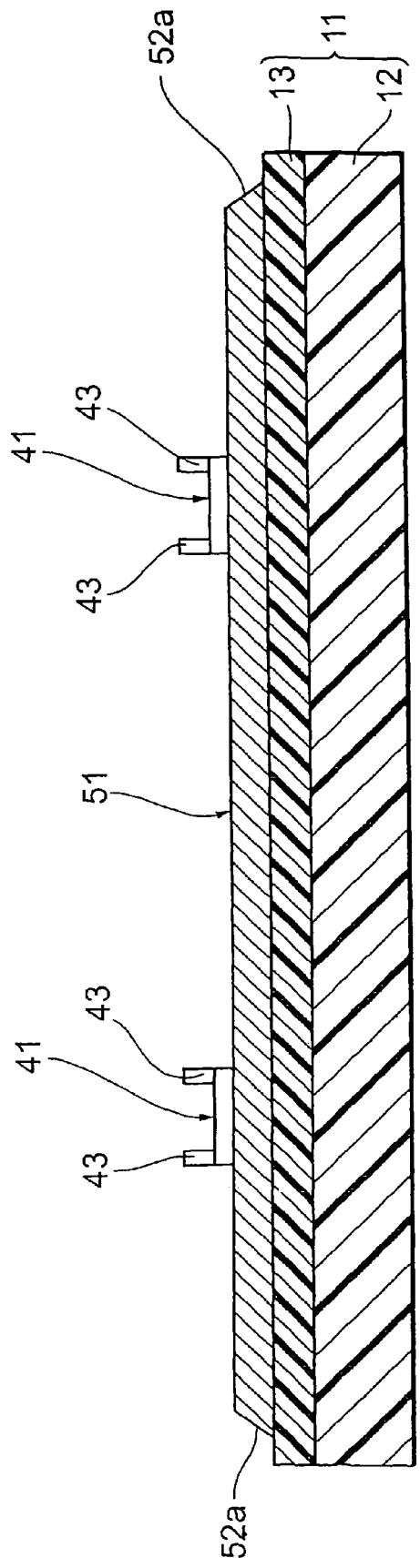
FIG. 9 is a cross-sectional diagram taken along the line VIII-VIII in FIG. 8.
Figure 10:
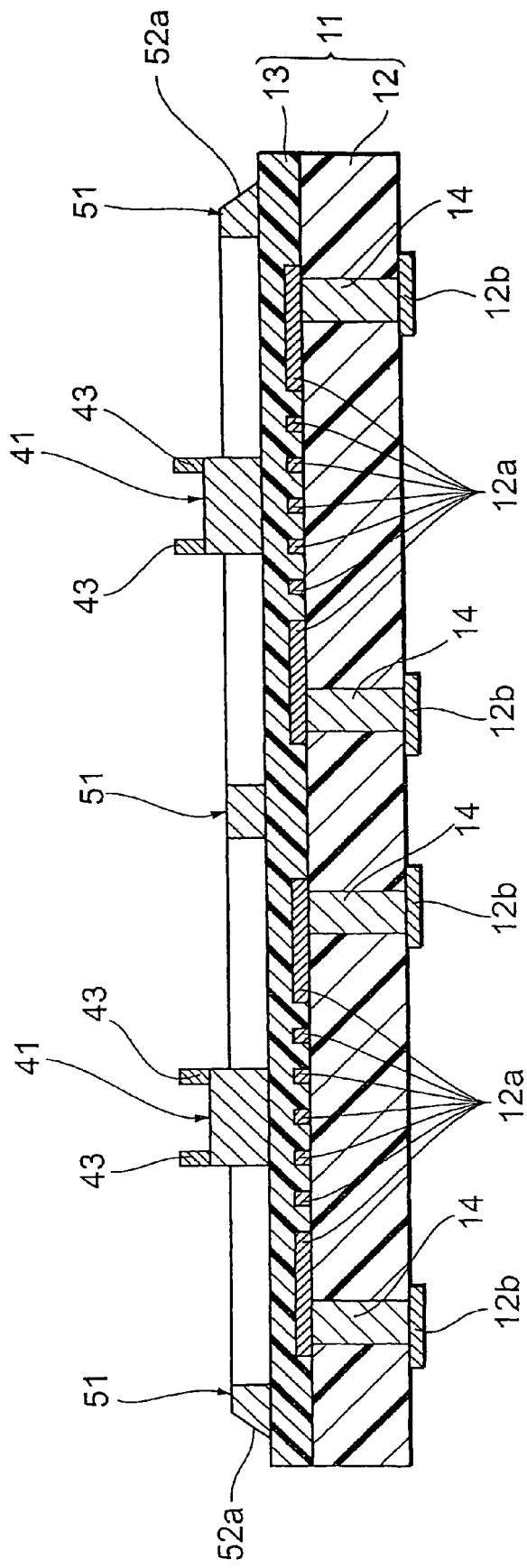
FIG. 10 is a cross-sectional diagram taken along the line X-X in FIG. 6.
Figure 11:
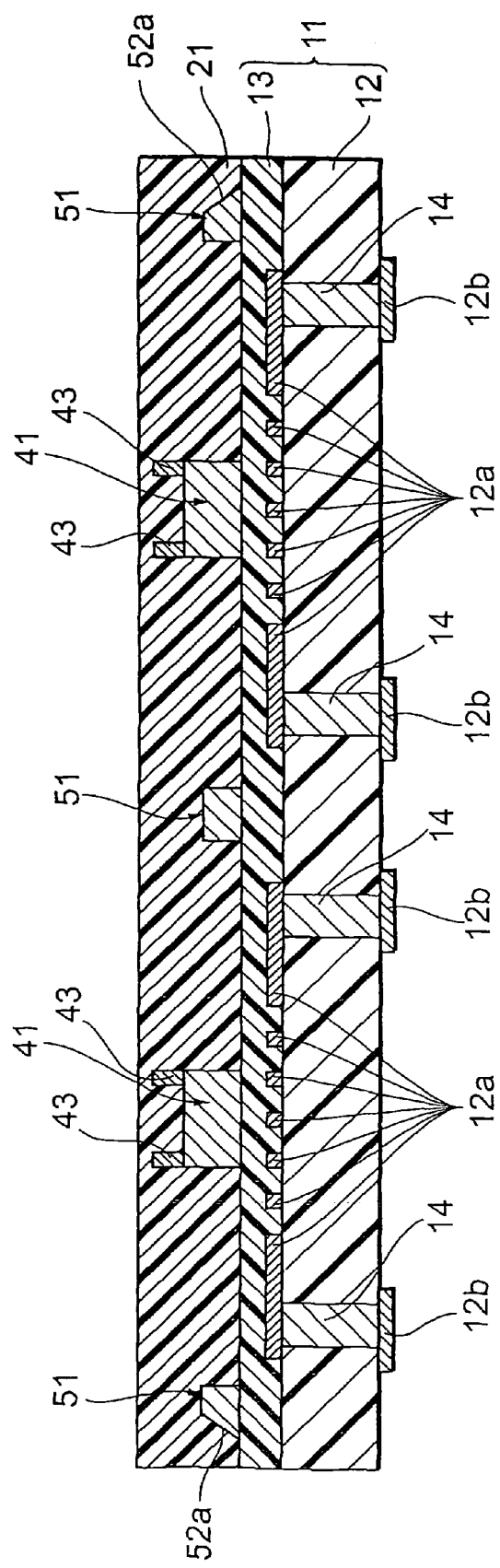
FIG. 11 is a flowchart showing an example of procedures for manufacturing the worksheet 100.

Furthermore, a plate-like frame member 51 is mounted on the insulating layer 13 of the substrate 11 (FIGS. 8 to 10). At this point, the plate-like frame member 51 is mounted on a predetermined position in a non-product area T that is an unmounted portion of the electronic component 41 so that the respective windows W of the plate-like frame member 51 match the product areas S1 to S4. Consequently, the plate-like frame member 51 is mounted so as to surround the electronic component 41 (FIGS. 8 to 10). In addition, the electronic component 41 and the plate-like frame member 51 are mounted on the same plane on the insulating layer 13 of the substrate 11 (FIGS. 9 and 10). The plate-like frame member 51 may either be mounted before mounting the electronic component 41 or be mounted at the same time the electronic component 41 is mounted.

Subsequently, an insulating layer 21 is formed so as to cover the electronic components 41 and the plate-like frame member 51 mounted on the insulating layer 13 of the substrate 11 as described above (FIG. 11). More specifically, thermosetting resin in an uncured or partially cured state is applied on the insulating layer 13 of the substrate 11, whereby the insulating layer 21 is formed by applying heat and curing the thermosetting resin.

Figure 12:
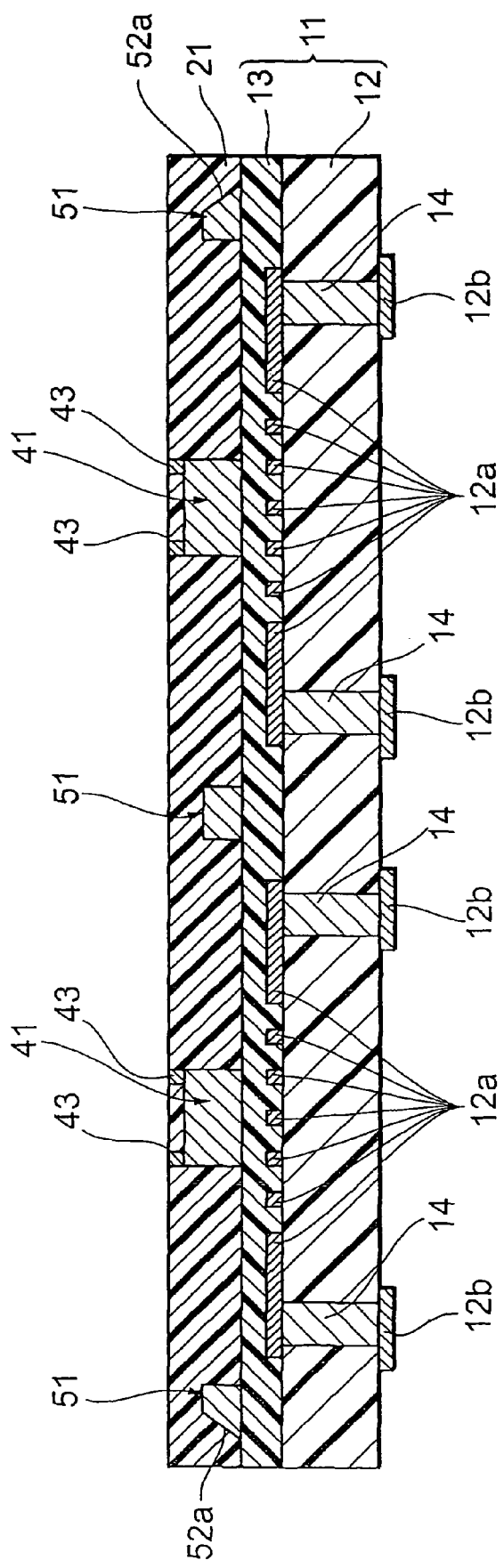
FIG. 12 is a flowchart showing an example of procedures for manufacturing the worksheet 100.

Next, portions of the insulating layer 21 are removed to expose the bumps 43 of the electronic components 41 (FIG. 12). The method of removing the insulating layer 21 may be selected from known methods as appropriate, and more specifically, employable methods include polishing with a grinder, blasting, and carbon dioxide gas laser irradiation.

Figure 13:
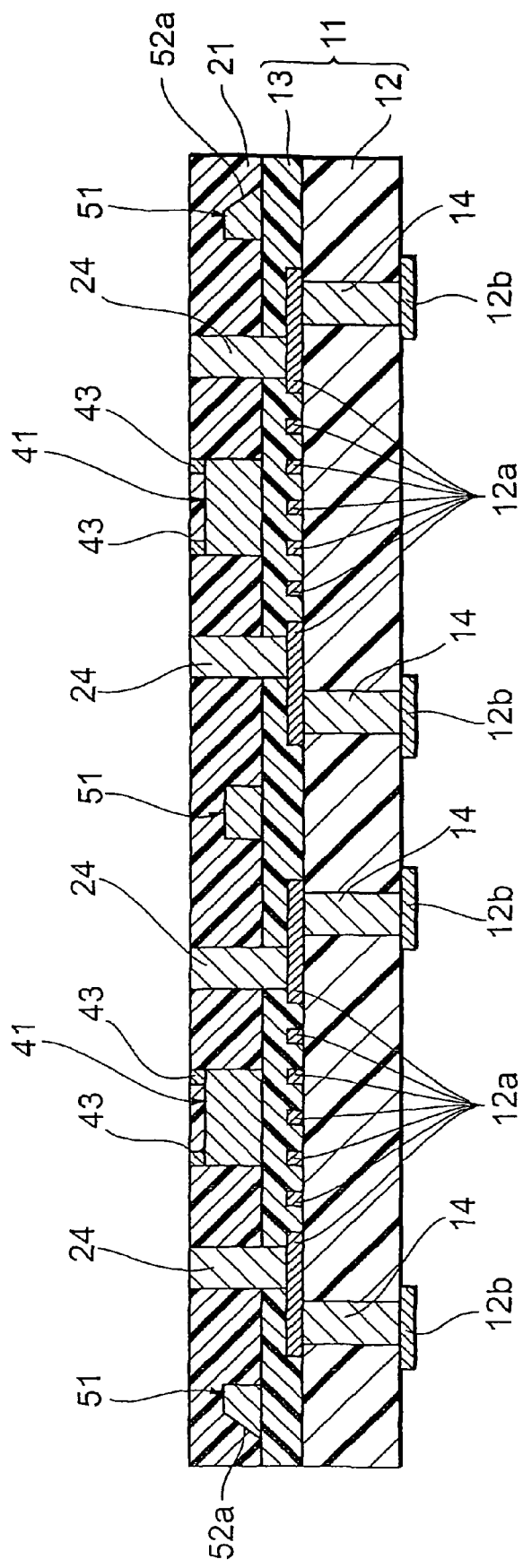
FIG. 13 is a flowchart showing an example of procedures for manufacturing the worksheet 100.
Figure 14:
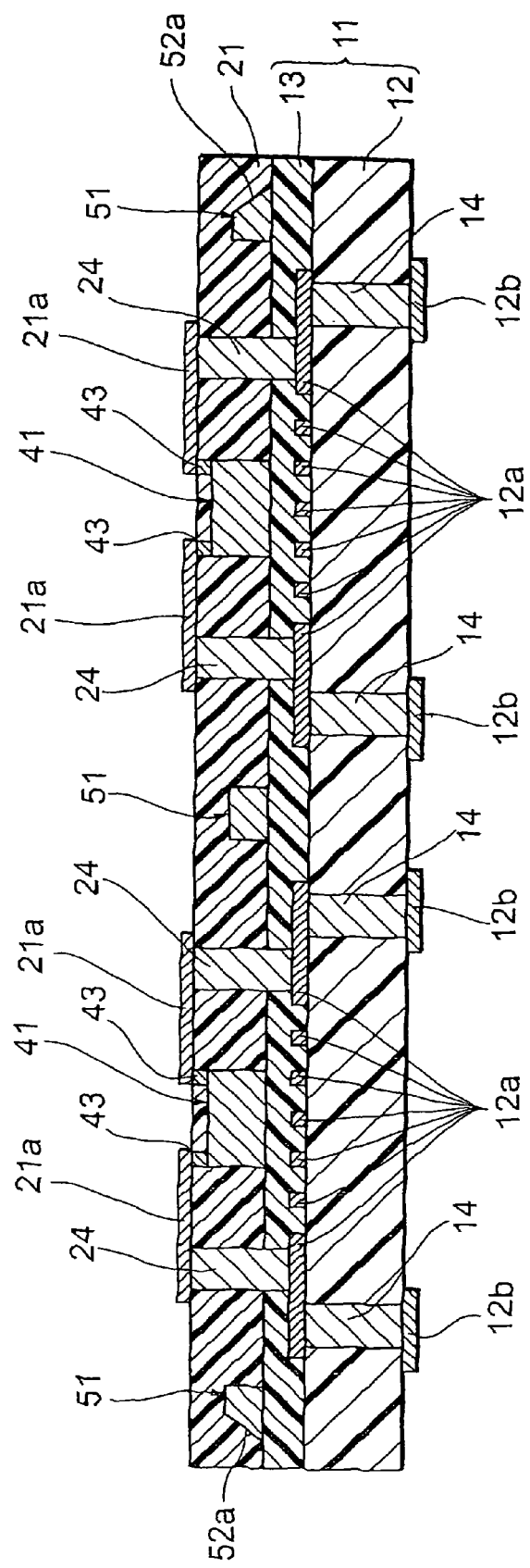
FIG. 14 is a flowchart showing an example of procedures for manufacturing the worksheet 100.

Vias 24 to penetrate the insulating layers 13 and 21 are respectively formed using a known method (FIG. 13). Then, using a known method such as the subtractive method or the additive method, a wiring layer 21a is formed on the insulating layer 31 in order to electrically connect the electronic components 41, the bumps 43, and the wiring layers 21a and 12a via the vias 24 (FIG. 14).

Subsequently, according to an accepted method, the worksheet 100 shown in FIG. 1 is completed by forming an insulating layer 31 on top of the insulating layer 21. Preferably, in the same manner as the insulating layer 21 described above, the insulating layer 31 is formed by applying an insulating epoxy resin that is a thermosetting resin onto the insulating layer 21 and then applying heat and curing the thermosetting resin.

When forming the insulating layers 21 and 31, it is preferable that after applying the thermosetting resin in an uncured or partially cured state and applying heat to partially cure the thermosetting resin, curing and forming are performed using pressing means. As a result, adhesion between the wiring layers 12a, 12b, 21a, insulating layers 12, 13, 21, 31, the electronic components 41 and the plate-like frame member 51 is improved. The curing/press molding may be performed while applying heat as necessary. In other words, various known means may be employed for forming the insulating layers 21 and 31. For example, in addition to methods such as screen printing and spin coating, pressing, vacuum lamination, pressure lamination and the like are also employable.

In addition, when using the plate-like frame member 51 that is thinner than the thickness t1 of the electronic component 41 and which includes the inclined surface 52a that is inclined towards the outer periphery of the frame, since the thickness of the plate-like frame member 51 decreases in a direction towards the outer periphery of the substrate 11 or, in other words, since the spatial volume ratio occupied in the insulating layer 21 decreases in the direction towards the outer periphery of the substrate 11, during curing/press molding, uncured (partially cured) resin can flow from the product areas S1 to S4 through the non-product area T in the direction towards the outer periphery of the substrate 11 in an easier manner. Therefore, pressure can now be evenly applied to the product areas S1 to S4 in an easier manner, thereby improving the adhesion between the wiring layers 12a, 12b, 21a, insulating layers 12, 13, 21, 31, the electronic components 41 and the plate-like frame member 51, and improving the uniformity and flatness of the thicknesses of the worksheet 100 and the product areas S1 to S4. Furthermore, since bubbles that may exist or may be incorporated between the wiring layers 12a, 12b, 21a, insulating layers 12, 13, 21, 31, the electronic components 41 and the plate-like frame member 51 can now be removed efficiently, occurrences of manufacturing/processing problems can be suppressed and process yield and mounting reliability can be improved.

Figure 15:
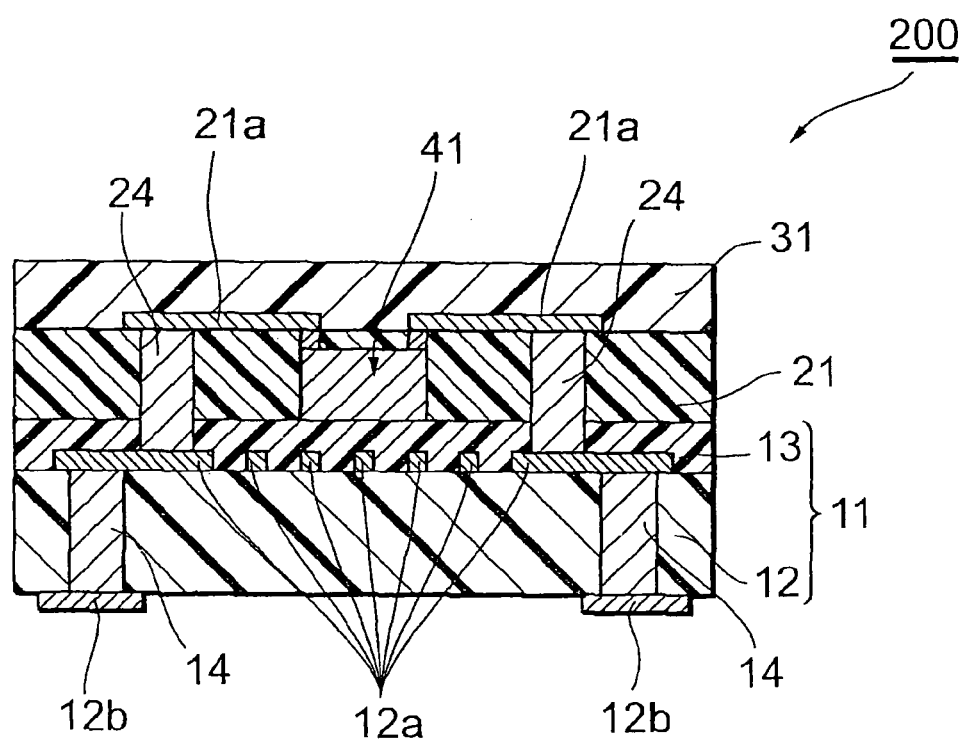
FIG. 15 is a cross-sectional diagram showing a schematic configuration of an individual substrate 200.
Figure 16:
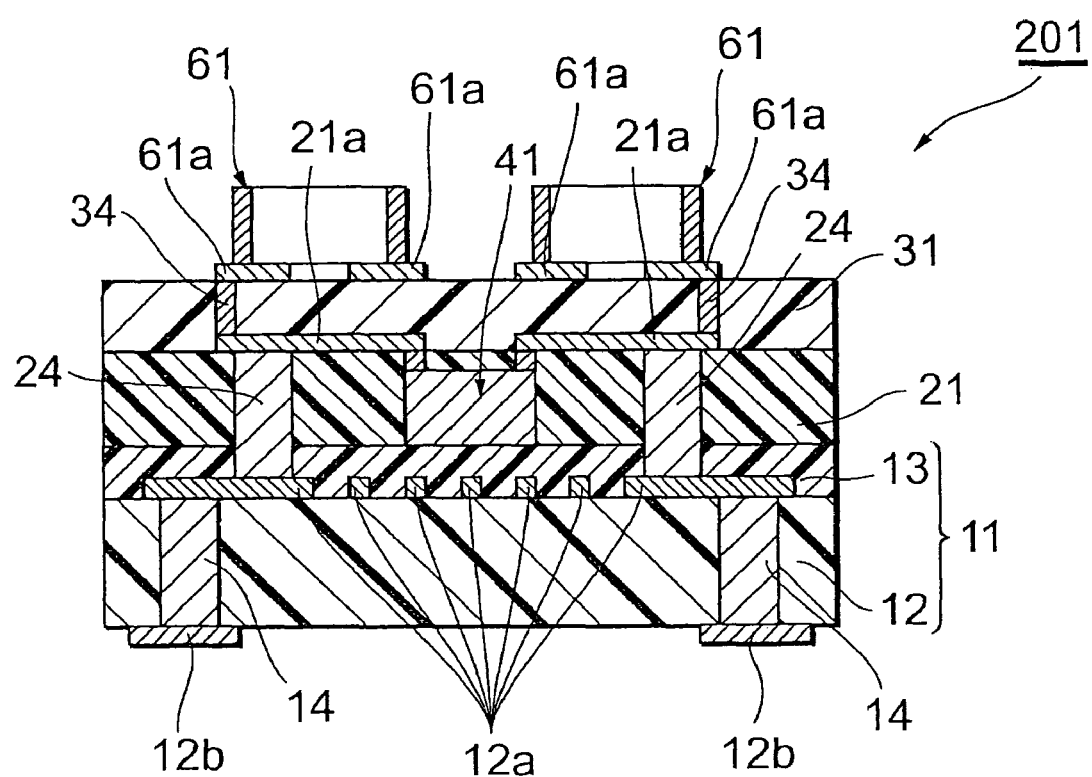
FIG. 16 is a cross-sectional diagram showing a schematic configuration of an electronic component-embedded module 201.

Subsequently, individual substrates (electronic component-embedded boards) 200 are obtained by separating the worksheet 100 described above into the respective product areas S1 to S4 by a known method such as dicing (FIG. 15). Moreover, electronic component-embedded modules (electronic component-embedded boards) are obtained by surface-mounting desired electronic components onto the obtained individual substrates 200. As an example thereof, an electronic component-embedded module 201 is shown in which a via 34 penetrating a wiring layer 61a and an insulating layer 31 is formed and passive parts 61 such as a resistor, a capacitor or the like are provided (FIG. 16).

In the method of manufacturing the worksheet 100 described above, since a plate-like frame member 51 whose linear coefficient of thermal expansion satisfying formula (1) above is disposed in the non-product area T, the differences between the respective degrees of thermal expansion and thermal contraction of the product areas S1 to S4 and the non-product area T are reduced and nonuniform internal stress that occurs during the formation of the insulating layers 21 and 31 is alleviated. In addition, since the plate-like frame member 51 functions as internal structures that alleviate shape variations of the substrate against the application of stress, substrate strength is enhanced. Consequently, occurrences of warpage of the substrate can be effectively suppressed.

Furthermore, the plate-like frame member 51 alleviates shape variations of the substrate as an internal structure. Therefore, the occurrence of warpage can be suppressed against the application of undesirable stress during buildup of the wiring layer 21a and the insulating layer 31, during surface-mounting of the passive parts 61, or the like.

In addition, since the plate-like frame member 51 is mounted so as to surround the electronic components 41, differences between the respective degrees of thermal expansion and thermal contraction can be asymptotically reduced within the sheet plane without directional anisotropy, and substrate strength can be enhanced without directional anisotropy.

Furthermore, since the plate-like frame member 51 is mounted in the same plane as the electronic components 41, nonuniform stress applied in the thickness direction of the substrate 11 can be alleviated and the occurrence of warpage can be suppressed even more effectively.

On the other hand, with the obtained worksheet 100, since warpage is suppressed and substrate strength is now enhanced, improved handleability can be achieved during manufacturing/processing such as conveyance, buildup, surface mounting and the like. Therefore, using the worksheet 100 described above enables subsequent occurrences of manufacturing/processing problems to be suppressed, and process yield and mounting reliability to be improved.

Second Embodiment

Figure 17:
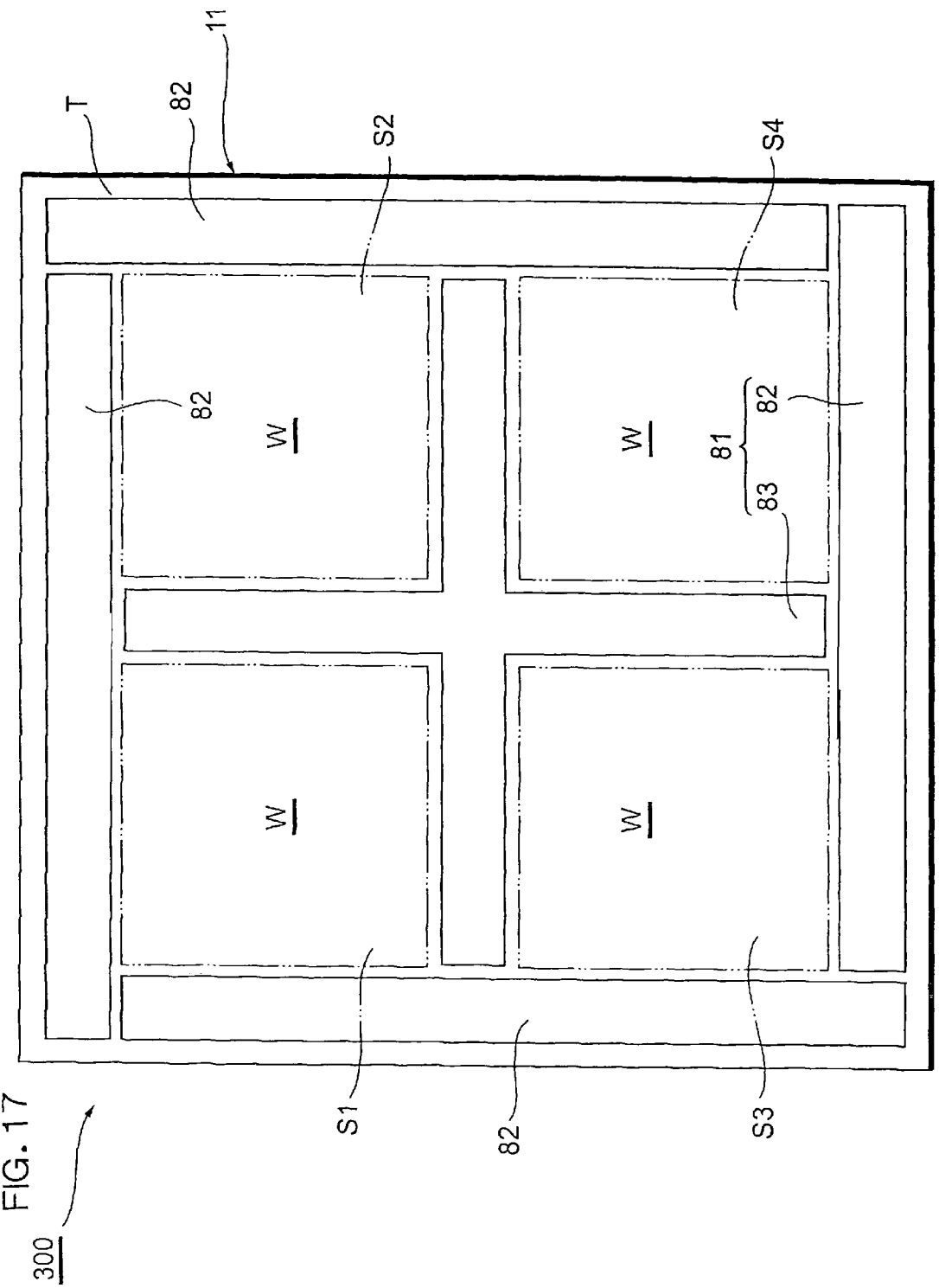
FIG. 17 is a plan view showing a schematic configuration of a second embodiment of an electronic component-embedded board according to the present invention.

FIG. 17 is a plan view showing a schematic configuration of a second embodiment of an electronic component-embedded board according to the present invention. A worksheet 300 is configured similar to the worksheet 100 according to the first embodiment described above, expect that a member 81 satisfying formula (1) above is provided in place of the plate-like frame member 51. The member 81 is constituted by plate members 82 having a rectangular cross-section and a cross-like plate member 83 having a rectangular cross-section and, as shown, a plurality of plate members 82 are disposed in a frame-like arrangement in a peripheral edge portion of the substrate 11 and the cross-like plate member 83 is disposed inside the frame. In addition, the plate members 82 are thinner than the plate member 83.

Operations and effects similar to those of the first embodiment described above can be achieved also using the member 81 described above. In addition, since the member 81 is separately configured by the plate members 82 and the plate member 83 which both have straight forms, handleability and versatility of the member 81 are enhanced, thereby contributing to the improvement of productivity.

Third Embodiment

Figure 18:
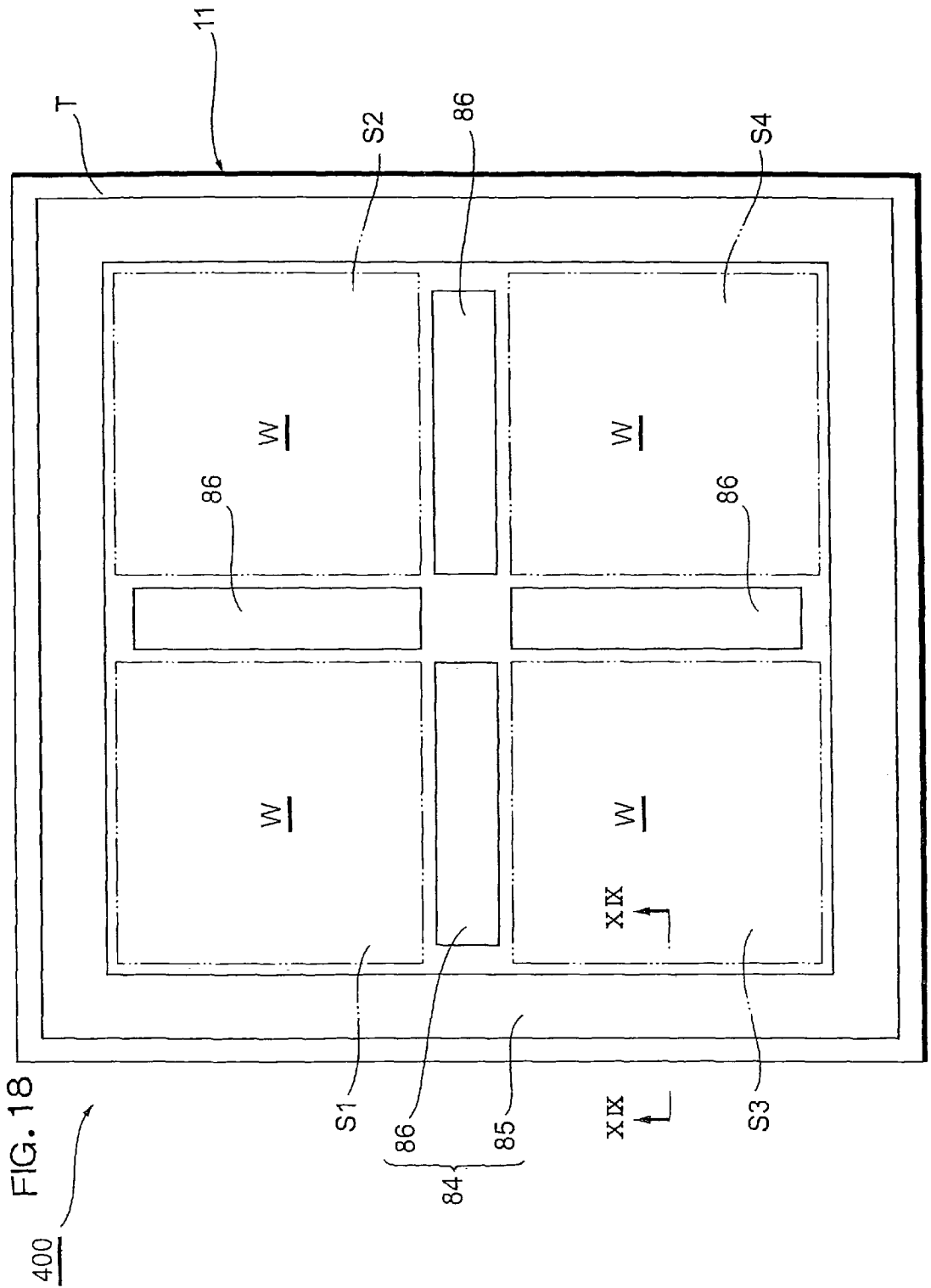
FIG. 18 is a plan view showing a schematic configuration of a third embodiment of an electronic component-embedded board according to the present invention.
Figure 19:
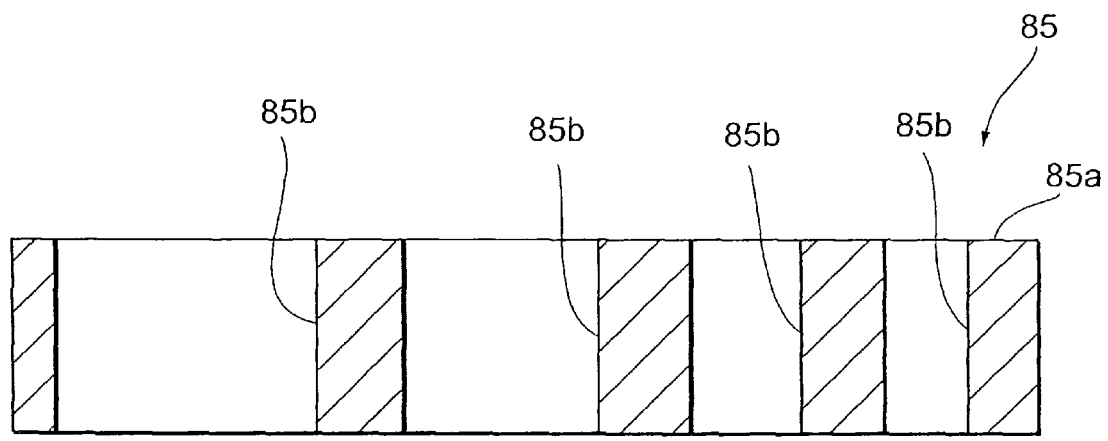
FIG. 19 is a cross-sectional diagram taken along the line XIX-XIX in FIG. 18.

FIGS. 18 and 19 are, respectively, a plan view and a partially cross-sectional view showing a schematic configuration of a third embodiment of an electronic component-embedded board according to the present invention. A worksheet 400 is configured similar to the worksheet 100 according to the first embodiment described above, expect that a member 84 satisfying formula (1) above is provided in place of the plate-like frame member 51. The member 84 is constituted by a frame member 85 in which a plurality of various through-holes (recesses) 85b are formed on a roughened surface 85a, and plate members 86 having a rectangular cross section, and as shown, the plate members 86 are disposed within the frame that is the frame member 85. For brevity, the through-holes 85b are not shown in FIG. 18. The through-holes 85b provided on the surface 85a of the frame member 85 are disposed so that volumes of the recesses (inner volumes) increase in a direction towards the outer periphery of the substrate 11.

Figure 20:
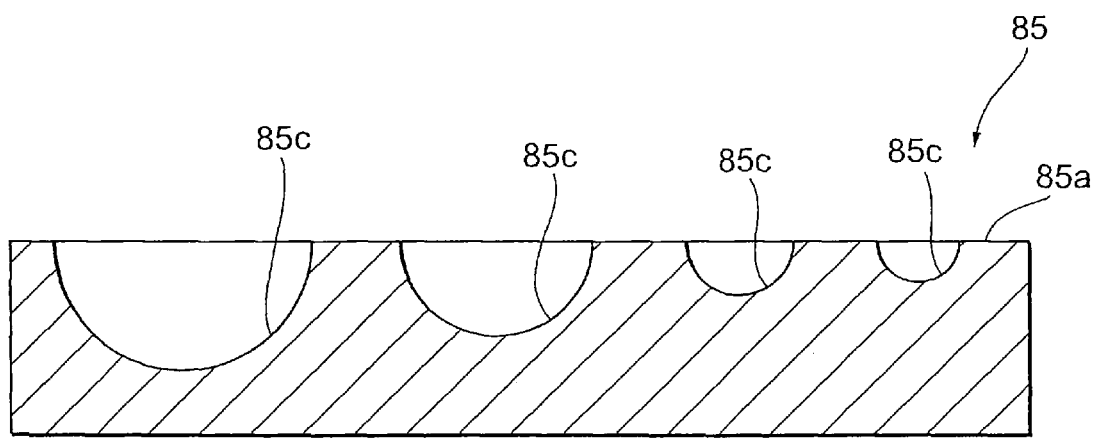
FIG. 20 is a cross-sectional diagram showing a schematic configuration of a variation of a third embodiment of an electronic component-embedded board according to the present invention.

Operations and effects similar to those of the first and second embodiments described above can be achieved also using the member 84 described above. Furthermore, since the member 84 includes a roughened surface 85a, adhesion between the insulating layer 21 is increased and occurrences of strength reduction during handling due to flaking or separation of the member 84 as well as occurrences of dropout and scattering of the insulating layers 13 and 21 during dicing can be reduced, thereby contributing to the improvement of handleability. Moreover, as shown in FIG. 20, non-penetrating holes (depressions, recesses) 85c may be formed in place of the through-holes 85b.

While an assembly substrate and an individual substrate embedded with a semiconductor IC as the electronic component 41 have been described for the first to third embodiments presented above, in place of and/or in addition to such a semiconductor IC, the present invention can be similarly implemented using a substrate embedded with an electronic component such as a varistor, a resistor, a capacitor, an inductor, a filter, an antenna, a transformer, and the like.

As described above, the electronic component-embedded board and the method of manufacturing the same according to the present invention enables nonuniform internal stress that occurs during heating to be alleviated and substrate strength to be improved at low cost and with a simple configuration without requiring complicated processes. In turn, the occurrence of warpage can be effectively suppressed and productivity, economic efficiency and product reliability can be enhanced. As a result, contributions can be made towards further thinning when modularizing the electronic component, and the present invention may be widely and efficiently utilized in electronic devices, apparatuses, systems, various devices and the like embedded with a thinned electronic component, particularly in those requiring downsizing, thinning and higher performance as well as in the manufacturing of the same.

What is claimed is:

1. A method of manufacturing an electronic component-embedded board, comprising:
   a step of preparing a substrate;
   a step of mounting an electronic component on the substrate;
   a step of mounting a member on an electronic component-unmounted portion of the substrate;

a step of forming an insulating layer on the substrate so as to cover the electronic component and the member; and a step of forming a wiring layer on at least one of the substrate and the insulating layer, wherein the member satisfies a relation represented by the following formula (I), $$\alpha 1 < \alpha 3 \text{ and } \alpha 2 < \alpha 3 \qquad (1),$$

in which $\alpha 1$ is the linear coefficient of thermal expansion of the electronic component (ppm/K), $\alpha 2$ is the linear coefficient of thermal expansion of the member (ppm/K), and $\alpha 3$ is the linear coefficient of thermal expansion of the substrate, the wiring layer or the insulating layer (ppm/K), and the member has a spatial volume ratio occupied within the insulating layer that decreases in a direction towards an outer periphery of the substrate.

2. The method of manufacturing an electronic component-embedded board according to claim 1, wherein
the step of mounting the member includes mounting the member so as to surround the electronic component.

3. The method of manufacturing an electronic component-embedded board according to claim 1, wherein
the step of mounting the member includes mounting the electronic component and the member on approximately the same plane.

4. The method of manufacturing an electronic component-embedded board according to claim 1, wherein
as the member, a member is used that is thinner than the electronic component.

5. An electronic component-embedded board comprising:
a substrate;
an electronic component mounted on the substrate;
a member mounted on an electronic component-unmounted portion of the substrate;
an insulating layer formed so as to cover the electronic component and the member; and
a wiring layer formed on at least one of the substrate and the insulating layer,
wherein the member satisfies a relation represented by the following formula (I), $$\alpha 1 < \alpha 3 \text{ and } \alpha 2 < \alpha 3 \qquad (1),$$

in which
$\alpha 1$ is the linear coefficient of thermal expansion of the electronic component (ppm/K),
$\alpha 2$ is the linear coefficient of thermal expansion of the member (ppm/K), and
$\alpha 3$ is the linear coefficient of thermal expansion of the substrate, the wiring layer or the insulating layer (ppm/K), and
the member has a spatial volume ratio occupied within the insulating layer that decreases in a direction towards an outer periphery of the substrate.

* * * * *